United States Patent [19]

Hedberg et al.

[11] Patent Number: 4,870,370
[45] Date of Patent: Sep. 26, 1989

[54] METHOD AND APPARATUS FOR TWO STAGE AUTOMATIC GAIN CONTROL

[75] Inventors: Dave Hedberg, Danville; Chris Cole, Los Altos; Steve Levy, Nevada City, all of Calif.

[73] Assignee: Silicon Systems, Inc., Tustin, Calif.

[21] Appl. No.: 157,988

[22] Filed: Feb. 19, 1988

[51] Int. Cl.⁴ ............................................... H03G 3/20
[52] U.S. Cl. .................................... 330/133; 330/134; 379/347
[58] Field of Search ............... 330/129, 133, 134, 138, 330/279, 280; 455/241, 242, 247; 379/347; 375/98

[56] References Cited

U.S. PATENT DOCUMENTS 4,213,097 7/1980 Chiu et al. ..................... 330/133 X Primary Examiner—James B. Mullins
Attorney, Agent, or Firm—Hecker & Harriman

[57] ABSTRACT

The present invention is a method and apparatus for implementing a two stage AGC circuit. In the preferred embodiment, the present invention is used as part of a receive channel in a modem. The first stage of the AGC is a "coarse" AGC and is used to track large signal transients of an input signal. The coarse AGC locks on to transient signals without excessive settling time. In operation, the coarse AGC acquires a new signal by using a nonlinear clipped feedback loop technique supported by a linearized feedback loop. The coarse AGC stage uses an error signal derived from the noncoherent power fluctuations of the incoming signal. The second stage of the AGC circuit is a "fine" AGC using a decision-directed coherent amplitude error signal and a quick linear feedback loop to correct for finer signal level fluctuations. The fine AGC has a high pass characteristic which decouples its response from that of the equalizer for stability reasons. The present invention avoids performance and response limitations of prior art AGC's in that the coarse stage is not required to have wide band response and associated noisy tracking response. Further, when the input signal is in quadrature amplitude modulation (QAM) the coarse stage tracks by using a nonlinear power detection algorithm which removes the effect of data power modulation. The fine AGC stage utilizes a decision-directed (coherent) error signal and a linear feedback loop with zero excess delay so that wideband response can be achieved without introducing amplitude modulation error in the signal path. As a result, the two stage scheme of the present invention can track rapid gain changes and restore correct data detection within a few baud, limiting error corruption to only one data block.

13 Claims, 3 Drawing Sheets

METHOD AND APPARATUS FOR TWO STAGE AUTOMATIC GAIN CONTROL

BACKGROUND OF THE INVENTION

I. FIELD OF THE INVENTION

This invention relates to the field of automatic gain control circuits.

II. BACKGROUND ART

Automatic gain control (AGC) circuits are used to maintain a constant amplitude signal output level regardless of the level of an input signal. In other words, although the amplitude of an input signal level may vary, the output of the AGC circuit is a constant amplitude. Whereas a typical electronic amplifier accepts an incoming electronic signal and amplifies that signal by a fixed amount, an AGC provides only enough amplification to reach the desired output amplitude level.

One use for AGC circuits is in communication receiving channels, such as found in a modem or similar application. Input signals on a telephone line, varying in amplitude, are inputted to the AGC circuit. It is desired that the input signal be amplified to a fixed level for subsequent processing and decoding. Therefore, the AGC amplifies the input signal to a fixed output level.

In the prior art, a single AGC stage is used for controlling the level of an input signal. In operation, the gain of an AGC circuit amplifier stage varies inversely to the amplitude of the input signal level. As the amplitude of the input signal increases, the amount of gain is reduced. The AGC is initialized at a predetermined reference level which the AGC seeks to maintain. When amplitude of the input signal falls below this predetermined threshold level, the AGC circuit senses the decrease in amplitude at the output of the amplifier. The AGC circuit then increases the amplifier stage gain until the amplitude of the output signal increases to the reference level. If the amplitude of the input signal is above the nominal reference level, the AGC circuit senses the increase in amplitude at the output of the amplifier stage and decreases the amplifier stage gain until the amplitude of the output signal decreases to the reference level.

The amount that the gain stage in a digitally controlled AGC can be increased or decreased is "stepped". In other words, each change in gain is taken in discrete steps. Thus, if an input signal level is below the desired reference level, the amplifier gain is increased one level at a time until the input signal level is "captured", that is matched by the increased gain.

A signal input line is subject to "transients", large spikes of noise which may be of very short duration with a stepped AGC design, if the transient is much larger than the individual increments in gain stage level, then there could be an unacceptable amount of time spent in "capture" of the incoming signal. In addition, if the amplitude falls rapidly, there could be a long "settling time" while the gain stage is stepped down to the proper level. During this settling time, the output of the AGC circuit is not accurate, resulting in incorrect data being outputted to the remainder of the circuit. Therefore, large transients or noise may cause long bursts of data error. If the gain increments are made large enough to handle large transients in a minimum amount of steps, then small transients will typically be ignored in order to avoid overshoot.

In other prior art schemes, AGC circuitry attacks the input signal by tracking signal envelope. This method of tracking is sensitive to data power modulation. As a result, the method of modulation influences the type of tracking algorithm utilized by the AGC circuit.

Therefore, it is an object of the present invention to provide an automatic gain control circuit which is independent of the data modulation technique of the input signal.

It is a further object of the present invention to provide an AGC having a reduced settling time.

It is still another object of the present invention to provide an AGC which has reduced transient amplitude sensitivity.

It is yet another object of the present invention to provide an AGC for tracking small amplitude disturbances.

SUMMARY OF THE PRESENT INVENTION

The present invention is a method and apparatus for implementing a two stage AGC circuit. In the preferred embodiment, the present invention is used as part of a receive channel in a modem. The first stage of the AGC is a "coarse" AGC and is used to track large signal transients of an input signal. The coarse AGC locks on to transient signals without excessive settling time. In operation, the coarse AGC acquires a new signal by using nonlinear step sizes supported by a linearized feedback loop. The coarse AGC stage uses an error signal derived from the filtered noncoherent power fluctuations of the incoming signal.

The second stage of the AGC circuit is a "fine" AGC using a decision-directed coherent amplitude error signal and a quick linear feedback loop to correct for finer signal level fluctuations. The fine AGC has a high pass characteristic to decouple its response from that of the other decision directed algorithms.

The present invention avoids performance and response limitations of prior art AGC's in that the coarse stage is not required to have wide band response and the associated noisy tracking response. Further, when the input signal is in quadrature amplitude modulation (QAM) the coarse stage power measurement window is enlarged to remove the effect of data power modulation.

The fine AGC stage utilizes a decision-directed (coherent) error signal and a linear feedback loop that has wideband response. As a result, the two stage scheme of the present invention can track rapid gain changes and restore correct data detection within a few baud.

DETAILED DESCRIPTION OF THE PRESENT INVENTION

A two stage AGC circuit with improved response and performance characteristics is described. In the following description, numerous specific details, e.g. amplitude ranges, number of stages, number of bits, etc., are set forth in order to provide a more thorough description of the present invention. It will be obvious, however, to one skilled in the art, that the present invention may be practiced without these specific details. In other instances, well known features have not been described in detail in order not to unnecessarily obscure the present invention.

The present invention is described in its preferred embodiment as a two stage AGC circuit. It will be obvious, however, that the present invention has equal application to multistage AGC circuits. Further, although the present invention is described in conjunction with a receive channel within a modem, it will be obvious that the present invention has equal application to all instances in which a constant level output signal is desired from a varying level input signal.

The present invention consists of two gain control stages. The first gain control stage is for coarse gain control and controls the gain of an input signal for large signal transients. In this first, coarse gain control stage, the power level of the input signal is determined and compared to a reference power level. A first error signal representing the difference between the calculated power level and the reference power level is generated. This difference signal is examined to determine if it is within the range of the coarse gain control stage or the fine gain control stage. If it is within the range of the first gain control stage, a gain scale factor is generated and used to correct the gain of the input signal. The output of the first gain control stage is coupled to the second gain control stage. In the preferred embodiment, the second gain control stage operates on the signal in a quadrature amplitude modulation (QAM) format. The input to the second gain control stage is quantized and the difference error between the input and quantized signals is generated. This difference is low pass filtered and a fine gain correction scaling factor is then generated and used to correct the input signal.

It should be noted that the preferred embodiment of the present invention approximates the phase by use of the imaginary portion of a complex word. Since in this implementation the phase deviation is kept small, the error introduced by the approximation is insignificant. Similarly, the magnitude of the error is approximated by the real portion of a complex word. Any errors introduced by this approximation are also insignificant. Of course, the actual phase and magnitude values may be used in implementing the present invention without departing from its scope.

Figure 1:
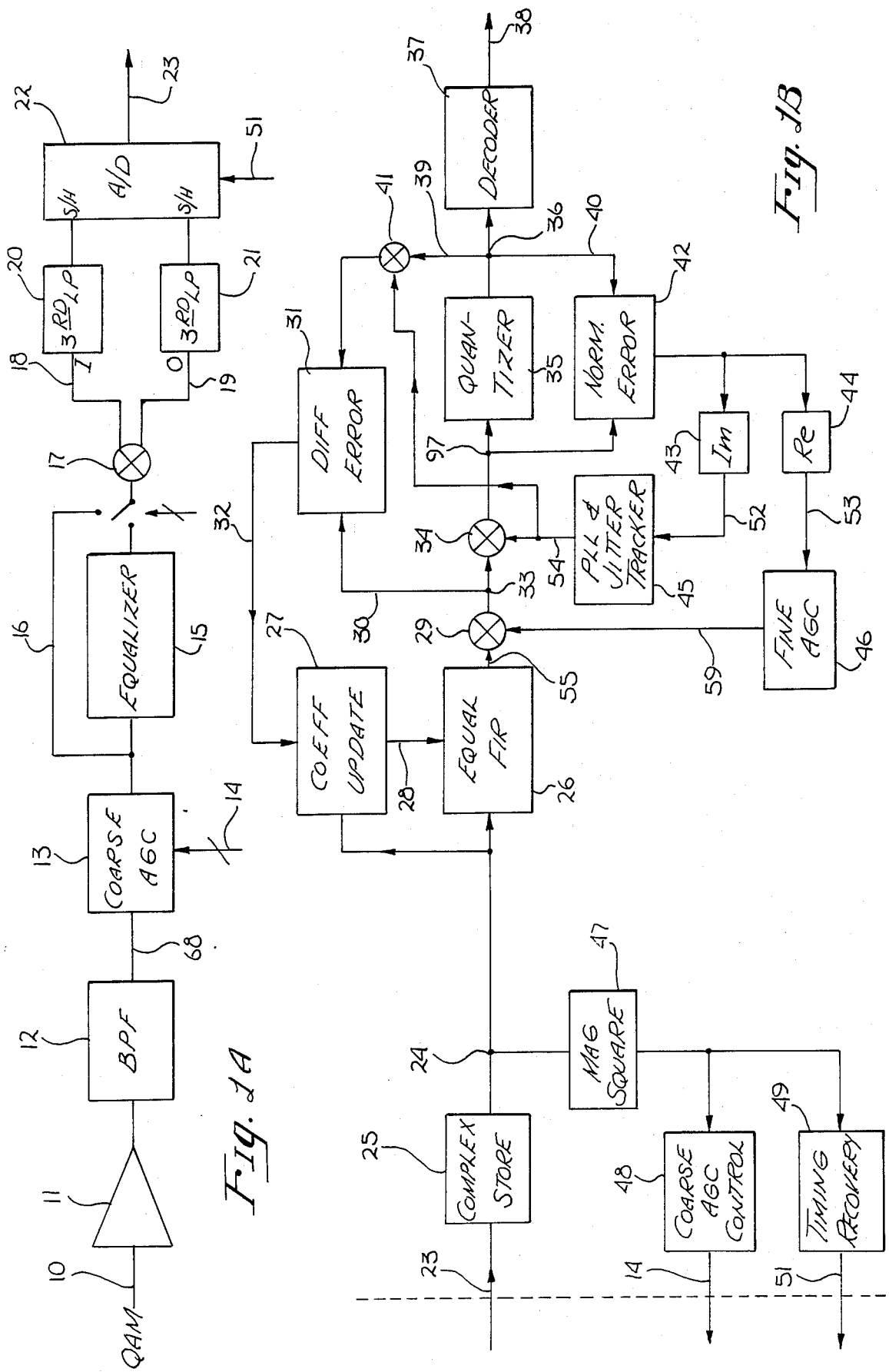
FIGS. 1A and 1B is a block diagram illustrating a receive channel utilizing the two stage AGC scheme of the present invention.

In the preferred embodiment, the present invention is used in the receive channel of a modem. Referring to FIGS. 1A and 1B, a block diagram of a modem receive channel is illustrated. In the example herein, the input signal is a quadrature amplitude modulation (QAM) signal. However, the present invention has equal application to DPSK signals. The QAM signal 10 is inputted to an anti-aliasing filter 11. The output of the anti-aliasing filter 11 is passed through a band pass filter 12 whose output is coupled to the coarse AGC stage 13 of the present invention. The coarse AGC stage tracks large transients with a low settling time. A digital input controls the gain of coarse AGC 13 and is inputted into coarse AGC 13 on bus 14. In the preferred embodiment, the digital word is 7 bits but may be of any desired length without departing from the scope of the present invention.

The output of the coarse AGC stage 13 is inputted to equalizer 15. A bypass loop 16 couples the input of equalizer 15 alternatively to the input of fixed demodulator 17. The output of equalizer 15 is coupled to fixed demodulator 17. Fixed demodulator 17 outputs both inphase and quadrature demodulated portions of the input signal. The phase signal I18 is inputted to a third order low pass filter 20. The quadrature portion Q19 of the demodulated signal is inputted to third order low pass filter 21. The outputs of filters 20 and 21 are inputted to sample and holds of the analog to digital converter (A/D) 22.

The inphase and quadrature signals are sampled simultaneously and one is held in a sample and hold while the other is immediately sent to the remainder of the signal path. The quadrature signal is held and then converted and sent on to the digital signal path circuitry. In the preferred embodiment of the present invention, the sample and hold is on the quadrature channel. The output of the A/D 22 is two 8 bit words in offset binary format.

The output 23 of A/D 22 is coupled at node 24 to four word complex store 25. The output of four word complex store 25 is inputted to equalizer/finite impulse response (FIR) filter 26. The output of complex store 25 is also inputted to coefficient update 27. The output 28 of coefficient update 27 is inputted to equalizer/FIR 26. The output 55 of FIR 26 is inputted to fine AGC gain coefficient 29. The output of fine AGC coefficient 29 at node 33 is coupled on line 30 to differential error 31 and phase coefficient 34. The output of phase coefficient 34 is coupled to quantizer 35 and normalized error 42.

The output of quantizer 35 at node 36 is coupled to decoder 37. The output 38 of decoder 37 is the output of the receive channel. The output of quantizer 35 at node 36 is also coupled on line 39 to decision modifier 41 and on line 40 to normalized error 42. The output of decision modifier 41 is coupled to differential error 31 whose output 32 is coupled to coefficient update 27. The outputs 28 of coefficient update 27 is coupled to equalizer/FIR 26.

It should be noted that calculation of the phase of a complex valued signal is costly in terms of processor resources. The preferred embodiment approximates the phase by use of the imaginary portion of the complex word. Since in this implementation the phase deviation is kept small, the error introduced by the approximation is insignificant.

The output of normalized error 42 is coupled to Im 43 and Re 44. The output 53 of Re 44 is coupled to the fine AGC stage 46. The output 59 of fine AGC stage 46 is coupled to fine AGC gain coefficient 29. The output 52 of Im 43 is coupled to PLL 45. The output 54 of PLL 45 is coupled to phase coefficient 34 and decision modifier 41.

The output of mag squared 47 is coupled to coarse AGC control 48 and timing recovery 49. The output 14 of coarse AGC control 48 is coupled to the control line 14 of the coarse AGC stage 13. The output 51 of timing recovery 49 is coupled to A/D 22. THe output 51 determines when the sample and hold of the LPF outputs is performed.

The two stage AGC system used in the receive channel circuitry of FIGS. 1A and 1B achieves improved tracking performance for gain transients and AM noise peaks while maintaining stable tracking of the QAM signal level in the presence of normal data modulation. The coarse AGC stage uses an error signal derived from the noncoherent power fluctuations of the incoming signal. The coarse AGC acquires a new signal by using a fast nonlinear step size feedback loop technique in conjunction with a slow linearized feedback loop. After acquiring the signal, the purpose of the coarse AGC stage is to maintain a constant average signal level at the input to the A/D converter and through the modem front end signal processing blocks. The coarse AGC tracks the acquired signal by using a nonlinear error power detector and a slow first order tracking loop.

The fine AGC stage uses a decision-directed coherent amplitude error signal and a fast linear feedback loop that corrects for small faster signal level fluctuations. That is, for smaller transients of short time duration. The fine AGC loop has a high pass characteristic used to decouple its response from that of the other decision directed algorithms. The combined response of the coarse AGC and fine AGC determine the overall behavior of the receiver in the presence of signal level changes. This response can be optimized for best performance with the slowly varying and transient disturbances as typically encountered in telephone circuitry.

Still referring to FIGS. 1A and 1B, the QAM (or other) signal 10 is inputted to the receive channel circuitry at anti-aliasing filter 11. The output of anti-aliasing filter 11 is coupled to a band pass filter 12 which separates the input signal to two bands. In the preferred embodiment, there are two transmission bands, high and low, and the band pass filter 12 passes either the high or the low band to the processor. In the preferred embodiment, the input signal is received at 600 baud.

The output 68 of the band pass filter 12 is coupled to the coarse AGC 13. The coarse AGC has a dynamic range of 50 dB and is controlled by a digital word input on line 14. The gain increments of the coarse AGC 13, in the preferred embodiment, are approximately 0.37 to 0.4 dB per step. Because there are 128 steps (controlled by 7 bits) the dynamic range of the coarse AGC is 48 to 50 dB. In the preferred embodiment, the coarse AGC stage is implemented by OPAMPs and capacitor ratios which are selectively activated by means of the digital control signal. Such type of switched capacitor automatic gain control circuits are described in U.S. patent application Ser. No. 06/774,544 entitled MOS Switch Capacitor Automatic Gain Control Circuit and assigned to the assignee of the present invention.

The output of the coarse AGC 13 is coupled to equalizer 15. The bypass loop 16 is coupled between the input and output of equalizer 15. The bypass loop 16 is controlled by a control bit outputted by the coarse AGC control 48. Equalizer 15 introduces a delay into the signal path of approximately 3 to 4 milliseconds (on the order of 2 to 3 baud time). In the fast tracking mode, the bypass loop 16 is coupled from the output of coarse AGC 13 so that the equalizer 15 is bypassed. In the fast tracking mode, the input signal is locked onto by the coarse AGC. After signal acquisition, the bypass loop 16 is deactivated so that the equalizer 15 is active in the signal path. In this configuration, the circuit performs slow tracking of the input signal. If a large transient is detected, the bypass loop 16 is activated and the path returns to the fast tracking mode.

The output of equalizer 15 is coupled to fixed demodulator 17 which is used to generate inphase and quadrature versions of the input QAM signal. Both the inphase and quadrature outputs 18 and 19 of demodulator 17 are passed through low pass filters 20 and 21 and inputted to sample and holds of A/D 22. The input signal to A/D 22 is converted to an eight bit offset binary word.

The control signal 51 enables the sample and holds to capture a sample and begin the A/D conversion on one of the samples. After the I sample has been converted the Q sample is also converted and the A/D 22 outputs two digital words on line 23 to complex store 25. The complex store 25 is a four word complex store and stores four sample in real time, occurring at a 2400 Hz rate.

The output at node 24 of complex store 25 is inputted to mag square 47 which is simply the square of the sample from complex store 25. The coarse AGC integrates the samples to give the power level of the signal. This enables the coarse AGC control 48 to indicate a detected carrier on the input signal line. By using power detection, the present invention is independent of the modulation technique utilized in the input signal. Therefore, a single algorithm can be employed to provide automatic gain control and carrier level detection. For example, the present invention has equal applicability to QAM, DPSK, and FSK types of modulation schemes.

The remainder of the signal path is a series of interacting feedback loops including a differential error loop, a normalized error loop, and PLL and fine AGC loop associated with the normalized error loop. The differential error loop feeds back terms to FIR 26 to modify the coefficients of the equalizer so that the output of FIR 26 can minimize intersymbol interference. The normalized error loop is separated into an imaginary and real part, with the imaginary portion fed to a PLL and the real portion is inputted to the fine AGC control 46.

Node 24 is coupled to the FIR filter 26. In the preferred embodiment of the present invention, the FIR filter 26 is an 11 tap filter including a DC tap to remove DC offset from the incoming signal. The taps of the filter 26 store the second and fourth samples outputted by complex store 25. All four samples are used by the course AGC control 48 and timing recovery 49. However, the FIR filter is a T/2 equalizer, therefore, only the second and fourth samples are utilized in the FIR filter 26.

The FIR filter 26 is an equalizer with a prescribed response time. As a result, amplitude variations may occur more frequently than the equalizer/FIR filter 26 can respond. A fine AGC feedback loop is utilized to correct such amplitude errors. The fine AGC is limited by limiting block 101 of FIG. 3 to 3 dB of correction in the preferred embodiment of the present invention. Larger perturbations in amplitude are corrected by the coarse AGC.

Each of the taps in the equalizer/FIR 26 is multiplied by its corresponding coefficient (generated by the various feedback loops). The FIR 26 outputs one complex WORD 55 per baud. The complex WORD 55 is inputted to multiplier 29 and is multiplied by a gain coefficient 59 generated by fine AGC 46, (nominally a gain of one). The output of multiplier 29 at node 33 is, (when the loop is stabilized) a signal which has correct amplitude, although it may have phase and frequency offset and jitter.

The signal at node 33 is coupled to multiply 34 and is multiplied by the correction signal 54 to correct for frequency and phase offset. Signal 54 is the output of PLL and jitter tracker 45. The output of multiplier 54 at node 97 is ideally free of phase and frequency offset and jitter. This signal is now quantized at quantizer 35. The quantizer 35 outputs values which are quantized to specific points in the 16 point QAM constellation.

Quantizer 35 outputs 16 specific values at node 36. The difference error and normalized error are calculated for these values. The normalized error is a vector type error. The signal at node 97 is coupled to normalized error block 42 along with quantized signal 40 from node 36. The input signal 97 is divided by the quantized signal to give a ratioed difference for use by PLL 45 and fine AGC 46.

The output of normalized error block 42 is a two part signal having imaginary 43 and real 44 parts. The real portion 44 is the ratioed distance between the actual constellation point and the ideal constellation point assuming the residual carrier phase error is zero. Any distance errors are a result of gain errors. Therefore, this real portion 44 is coupled to fine AGC 46 for gain correction.

The imaginary portion 43 of the output of normalized error block 42 is the ratio phase difference of the actual constellation points and ideal constellation points. Thus, the imaginary portion 43 may be used for phase correction and is therefore coupled to PLL and jitter tracker 45 for phase, frequency and jitter correction.

The difference error block 31 has two inputs, one being the undemodulated signal 30 from node 33. The other input to difference error block 31 is the output of multiplier 41. Multiplier 41 combines the phase correction signal 54 and the quantized signal output of quantizer 35 at node 36. The output 32 of the difference error block 31 is the error introduced by the equalizer/FIR 26. This error signal 31 is coupled to coefficient update block 27 to update the tap coefficient of the equalizer/FIR 26.

Figure 2:
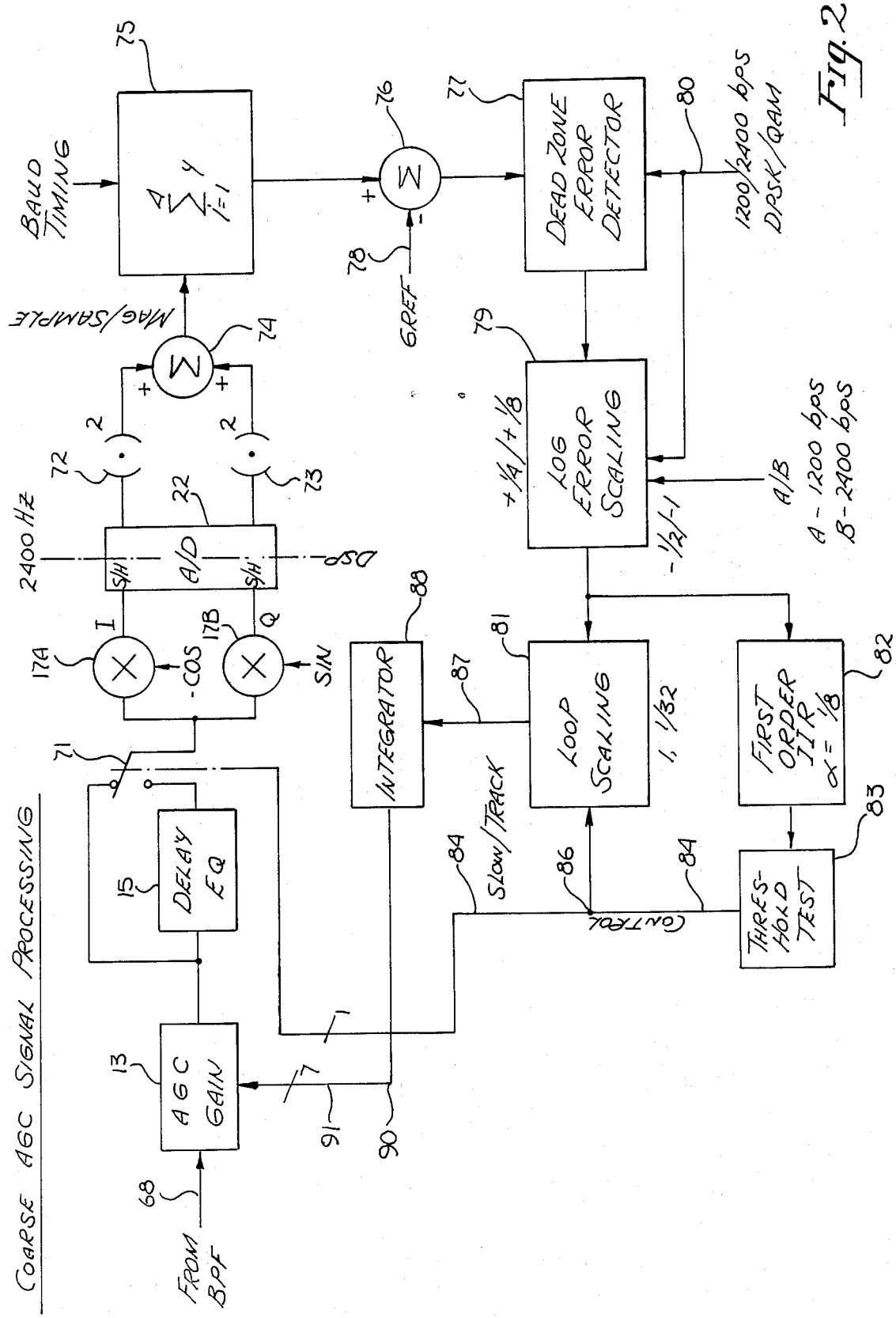
FIG. 2 is a block diagram illustrating the coarse AGC stage of the present invention.

The coarse AGC is shown in detail in FIG. 2. The signal 68 from band pass filter 12 is inputted to AGC gain 13. The output of AGC gain 13 is coupled to delay equalizer 15. Switch 17 controls the bypass loop 16. In the fast tracking mode, switch 71 is set so that delay equalizer 15 is bypassed. In the slow tracking mode, after lockup of the coarse AGC, switch 71 is set such that delay equalizer 15 is in the signal path from AGC gain 13. The output of delay equalizer 15 is coupled to fixed demodulators 17A and 17B. The signal at demodulator 17A is combined with a cosine wave, with the output of demodulator 17A being the inphase portion of the demodulated incoming signal. Demodulator 17B is combined with a negative sine wave and the output of demodulator 17B is the quadrature portion of the demodulated incoming signal. The inphase and quadrature outputs of demodulator 17A and 17B are inputted to sample and holds of analog to digital converter A/D 22. The two signals are sampled simultaneously in A/D 22. The inphase and quadrature portions are converted to eight bit digital words representing the magnitude of the signal. This magnitude is squared at multiplier 72 and coupled to summing node 74.

The output of summing node 74 is the magnitude squared of the sample and is coupled to sample summer 75. The sample summer integrates the sample to determine the area enclosed by the sample corresponding to a baud interval. This represents a power estimate of the input signal which is coupled to summing node 76. A reference 78 is also inputted to summing node 76. The output of summing node 76 is a differential error representing the difference in the power of the incoming signal to the reference power level. This signal is inputted to dead zone error detector 77. A control signal 80 enables the detector for either 1200 or 2400 bps operation, depending on the application. The reference changes depending on the mode of the incoming signal. The plus or minus value of the reference 78 defines a "window" relative to the power level of the incoming signal. For QAM schemes, this window is larger than for DPSK modulation schemes. The dead zone detector 77 determines whether the power estimate from sample summer 75 is inside or outside the window. If it is not within the window, coarse correction is done.

The output of dead zone error detector 77 is coupled to log error scaling (LES) circuit 79. LES 79 is utilized so that positive and negative errors are linearized for various amplitude levels. In the QAM mode, a positive going error is generally larger in a log sense than a negative going error. An A/B control signal enables LES 79 for 1200 and 2400 bps operation. The error signal output by dead zone error detector 77 is multiplied by the appropriate log error scaling approximation ($\frac{1}{4}$, $\frac{1}{8}$, $-\frac{1}{8}$, $-1$) so that the output or LES 79 is proportional to the log of the error.

The LES 79 outputs an error signal to loop scaling circuit 81 and filter 82. Loop scaling 81 determines the size of the steps taken by the coarse AGC to correct the gain. When loop scaling 81 selects a factor of one, large steps are taken until the input signal is within 3 dB of the desired power level. If the power level is within 3 dB, small (1/32 factor) steps are taken. Filter 82 is a first order infinite impulse response filter. The output of filter 82 is coupled to threshold test 83 which determines if the error is within the 3 dB window used for fine AGC control. The output of threshold test 83 is a 1 bit control signal 84 which is used to set switch 71 at delay equalizer 15. If the error is outside the 3 dB window, control signal 84 sets switch 71 so that bypass loop 16 is in the signal path of the coarse AGC. This sets the coarse AGC to a fast tracking mode.

If the error signal is within the 3 dB window, control signal 84 is such that switch 71 connects delay equalizer 15 to the signal path of coarse AGC 13. The control signal 84 is also coupled at node 86 to loop scaling circuit 81. The loop scaling circuit divides the error signal from LES 79 by 32 in the preferred embodiment of the present invention, when the error signal is within the 3 dB window. In this manner, the effect of the coarse AGC on signal input is minimized so that the fine AGC can accurately track the incoming signal. If the error signal is outside the 3 dB window, the loop scaling circuit 81 divides the error by 1 so that large increments of change in the gain stage of the coarse AGC may be achieved. The output of loop scaling circuit 81 is coupled on line 87 to integrator 88. Integrator 88 updates the previous value for the AGC word with the output 87 of loop scaling 81. The output of integrator 88 is a 7 bit digital signal controlling the gain stage of the coarse AGC.

Figure 3:
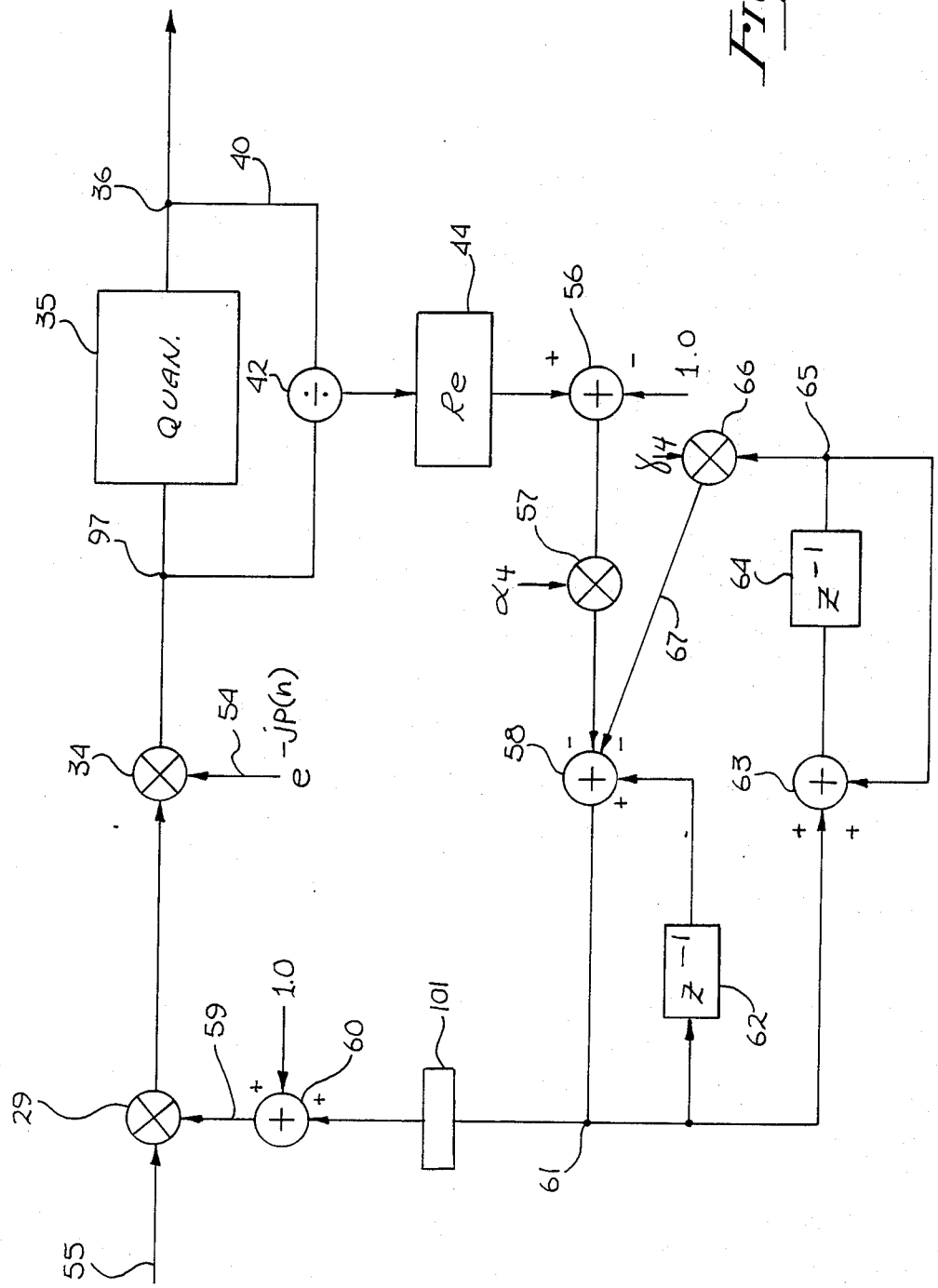
FIG. 3 is a block diagram illustrating the fine AGC stage of the present invention.

The fine AGC is shown in detail in FIG. 3. As previously stated, the fine AGC is part of a feedback loop coupling the output of quantizer 35 to fine AGC gain coefficient 29. The output 55 of FIR filter 26 is inputted to fine AGC gain coefficient 29. The output of fine AGC gain coefficient 29 is inputted to phase coefficient 34. The output of phase coefficient 34 is coupled to quantizer 35. The input and output 36 of quantizer 35 is coupled to divider 42 to generate an error signal representing the real portion of input signal 55. This real error 44 is coupled to adder 56. Also inputted to adder 56 is a negative 1 normalized signal.

The output of adder 56 is coupled to multiplier 57 where it is combined with $\alpha 4$. $\alpha 4$ is a multiplying function determining how much error signal, (the real part of the ratio) is added into the previous value for the fine AGC loop. The output of multiplier 57 is coupled to adder 58. The output of adder 58 is coupled in a feedback loop at node 61 to delay 62. The output of delay 62 is inputted to adder 58. Node 61 is also coupled in a feedback loop to adder 63. The output of adder 63 is coupled to delay 64 whose output 65 is coupled in a feedback loop to adder 63. The output 65 of delay 64 is coupled to multiplier 66 along with gain factor γ4. The output 67 of multiplier 66 is coupled to adder 58. Node 61 is coupled to adder 60 whose output 59 is coupled to fine AGC gain coefficient 29.

The fine AGC consists of a low pass filter (LPF) loop (ending at node 61) and a high pass filter (HPF) loop ending at node 65. The high pass filter decouples the fine AGC from the equalizer/FIR 26. The phase and amplitude corrected signal at node 97 is divided by the quantized signal at node 36 in divider 42. The real portion 44 of the output of divider 42 is coupled to adder 56 where a one is subtracted to determine the positive or negative percentage error in the signal. This percentage error is multiplied at multiplier 57 by α4 which is a scaling factor which determines the speed of the fine AGC loop. The larger value of α4, the faster the speed of the fine AGC loop. However, α4 has been chosen so as not to make the fine AGC loop unstable (constantly searching and compensating) so a value of α4 of less than one is chosen in the preferred embodiment of the present invention.

The output of multiplier 57 is coupled to adder 58. The output of adder 58 at node 61 is coupled in a feedback loop through delay 62. Delay 62 holds the previous sample so that adder 58 integrates the present error with the previous error. Node 61 is also coupled to adder 63. The output of adder 63 is coupled through delay 64 to node 65. Node 65 is coupled in a feedback fashion to adder 63.

As noted previously adder 63 and delay 64 function as a high pass loop whose output at node 65 is coupled to node 66. The purpose of the high pass filter loop is to decouple the fine AGC 46 from the equalizer/FIR 26. The output at node 65 is multiplied at multiplier 66 with a multiplying factor γ4. γ4 is set low (in the order of two to three Hz) so that the fine AGC is not responsive to DC.

The low pass filter loop is zero centered as is the high pass filter loop. The output 67 of multiplier 66 is also coupled to adder 58. The output of adder 58 at node 61 is coupled through limiting block 101 to adder 60 where a one is added. Signal 55 is multiplied by the output 59 of adder 60 at multiplier 29. Limiting block 101 implements a clipping function to limit the window of the fine AGC to plus or minus 3 dB.

Thus, a two stage AGC filter has been described.

We claim:

1. A circuit for controlling the gain of an input signal comprising:
    a first gain control stage coupled to said input signal for detecting an amplitude of said input signal, said first gain control stage for providing a first output signal having an amplitude within a first range;
    a second gain control stage coupled to said first output signal for detecting an amplitude of said first output signal, said second gain control stage for providing a second output signal having an amplitude within a second range;
    said first gain control stage comprising detection means for detecting the power level of said input signal, first comparing means for comparing said detected power level with a reference power level and for providing a first error signal, second comparing means coupled to said first error signal for providing a second error signal when said first error signal is within said first range, scaling means for converting said second error signal to a first gain scale factor, and first multiplying means for multiplying said input signal by said first gain scale factor;
    said second gain control stage comprising quantizing means coupled to said first output signal for quantizing said first output signal, third comparing means coupled to said quantized signal and said first output signal, said third comparing means for providing a third error signal representing a difference between said quantized signal and said first output signal, a first filter means coupled to said third error signal for scaling said third error signal to determine the sensitivity of said second gain control stage, said first filter means for providing a fourth error signal, second multiplying means coupled to said fourth error signal and said first output signal for multiplying said first output signal by said fourth error signal.

2. The circuit of claim 1 wherein said first range is greater than said second range.

3. The circuit of claim 1 wherein said detection means comprises first conversion means for converting said input signal into a complex signal having an inphase portion and a quadrature portion, and squaring means for squaring said complex signal to determine said power level of said complex signal.

4. The circuit of claim 1 wherein said quantizing means converts said first output signal to a quadrature amplitude modulation (QAM) constellation.

5. The circuit of claim 1 wherein said first filter means includes third multiplying means coupled to said third error signal and a second scaling factor and a low pass filter comprising integration means coupled to said third multiplying means.

6. A circuit for adjusting the amplitude of an analog input signal to a predetermined level comprising:
    a first gain control stage coupled to said analog input signal for detecting the amplitude of said input signal and for providing a first corrected signal having an amplitude within a first range;
    a second gain control stage coupled to said first gain control stage for detecting an amplitude of said first corrected signal, said second gain control stage for providing a second corrected signal having an amplitude within a second range;
    said first gain control stage comprising a first input means for receiving said analog input signal, first conversion means for converting said analog input signal to a digital signal, power detecting means for detecting a power level of said digital signal, first summing means coupled to said power detecting means and to a power reference level signal and for providing a first output signal representing the difference between said detected power level and said reference power level, first comparing means for providing a second output signal when said first output signal is outside a predetermined window, scaling means coupled to said second output signal for scaling said second output signal and for providing a third output signal representing a gain correction factor, first multiplying means for multiplying said analog input signal by said third output signal to correct the gain of said analog input signal;

said second gain control stage comprising second input means for receiving said digital signal from said first gain control stage, second conversion means for generating a quantized output signal form said digital signal, second summing means for generating a difference signal between said digital signal and said quantized signal, first filter means coupled to said difference signal and for providing a fourth output signal representing a gain correction factor, second multiplying means for multiplying said digital signal by said fourth output signal to correct the gain of said digital signal.

7. The circuit of claim 6 wherein said first conversion means further includes means for converting said analog input signal to a complex digital word having an inphase portion and a quadrature portion.

8. The circuit of claim 7 wherein said second gain control stage further includes a second filter coupled to said difference signal for decoupling the second gain control stage from said first gain control stage.

9. The circuit of claim 6 wherein said predetermined window is plus or minus 3 decibels.

10. The circuit of claim 6 wherein said first filter means comprises a low pass filter.

11. A method for adjusting the amplitude of an analog input signal comprising the steps of:
    determining a power level of said input signal and generating a power level signal;
    generating a first error signal representing a difference between said power level signal and a reference power level signal;
    determining if said first error signal is within a predetermined range;
    generating a first gain scale factor by multiplying said first error signal by a first scaling factor and multiplying said input signal by said first gain scale factor when said first error signal is not within said predetermined range;
    converting said input signal to a quantized signal;
    generating a second error signal representing a difference between said input signal and said quantized signal;
    generating a second gain scale factor by multiplying said second error signal by a second scaling factor and multiplying said input signal by said second gain scale factor when said first error signal is within said predetermined range.

12. The method of claim 11 wherein said step of determining a power level of said input signal is accomplished by converting said input signal to a complex digital signal having an inphase portion and a quadrature portion, and squaring said inphase and quadrature portions.

13. The method of claim 11 further including the step of filtering said second error signal with a low pass filter.

* * * * *

UNITED STATES PATENT AND TRADEMARK OFFICE
CERTIFICATE OF CORRECTION

PATENT NO. : 4,870,370

DATED : September 26, 1989

INVENTOR(S) : Hedberg et al.

It is certified that error appears in the above-identified patent and that said Letters Patent is hereby corrected as shown below:

In the drawings, sheet 1, Figure 1A, the legend "O" associated with quadrature portion 19 should read --Q--.

In column 2, line 52, "is a block diagram" should read --are block diagrams--.

In column 4, line 2, "phase" should read --inphase--;
line 17, delete "at node 24";
line 55, "THe" should read --The--.

In column 5, lines 9 and 10, "fluctuations. That is" should read --fluctuations, that is--.

In column 6, line 57, "multiply" should read --multiplier--;
line 60, "54" should read --34--.

In column 7, line 26, "31" should read --32--;
line 32, "17" should read --71--.

UNITED STATES PATENT AND TRADEMARK OFFICE
CERTIFICATE OF CORRECTION

PATENT NO. : 4,870,370
DATED : September 26, 1989
INVENTOR(S) : Hedberg et al.

It is certified that error appears in the above-identified patent and that said Letters Patent is hereby corrected as shown below:

In column 8, line 14, "or" should read --of--;
      line 58, after "The input" insert --97--;
      line 58, "is" should read --are--;
      line 65, delete ",".

In column 11, claim 6, line 35, change "form" to --from--.

Signed and Sealed this

Second Day of August, 1994

Attest:

BRUCE LEHMAN

Attesting Officer     Commissioner of Patents and Trademarks